(12) United States Patent
Earl et al.

(10) Patent No.: US 6,650,564 B1
(45) Date of Patent: *Nov. 18, 2003

(54) SYSTEM AND METHOD FOR ENABLING CHIP LEVEL ERASING AND WRITING FOR MAGNETIC RANDOM ACCESS MEMORY DEVICES

(75) Inventors: Ren D. Earl, Meridian, ID (US); Jeffrey A. McKee, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/341,768

(22) Filed: Jan. 13, 2003

Related U.S. Application Data

(63) Continuation of application No. 10/163,476, filed on Jun. 5, 2002, now Pat. No. 6,522,577.

(51) Int. Cl.[7] .......................... G11C 11/00; G11C 11/14; G11C 11/15
(52) U.S. Cl. .......................... 365/158; 365/171; 365/173
(58) Field of Search ................................ 365/158, 171, 365/173

(56) References Cited

U.S. PATENT DOCUMENTS

| | | | |
|---|---|---|---|
| 4,356,523 A | 10/1982 | Yeh | 360/113 |
| 5,917,749 A | 6/1999 | Chen et al. | 365/173 |
| 6,163,477 A | 12/2000 | Tran | 365/173 |
| 6,166,948 A | 12/2000 | Parkin et al. | 365/173 |
| 6,215,707 B1 | 4/2001 | Moyer | 365/189.07 |
| 6,351,409 B1 | 2/2002 | Rizzo et al. | 365/158 |
| 6,404,672 B2 | 6/2002 | Sato et al. | 365/173 |
| 6,501,678 B1 * | 12/2002 | Lenssen et al. | 365/158 |

* cited by examiner

Primary Examiner—Trong Phan
(74) Attorney, Agent, or Firm—Dorsey & Whitney LLP

(57) ABSTRACT

The system and method disclosed employ one or more switchable, close proximity electromagnets as part of the MRAM device circuit package to apply external magnetic fields to the magnetic elements and conductive lines of the MRAM array. A magnetic field generated by an electromagnet spanning all or part of an MRAM array could be used to selectively erase the MRAM array in whole or in part, respectively. In addition, the magnetic fields could be generated to support the magnetic fields sought to be induced by application of current to the row and column lines of the MRAM array, allowing for the writing of data to magnetic elements in the MRAM array using less power. In additional, diagonally disposed electromagnets could be used to generate these magnetic fields, and could also be used to demagnetize the row and column lines of the MRAM array.

25 Claims, 6 Drawing Sheets

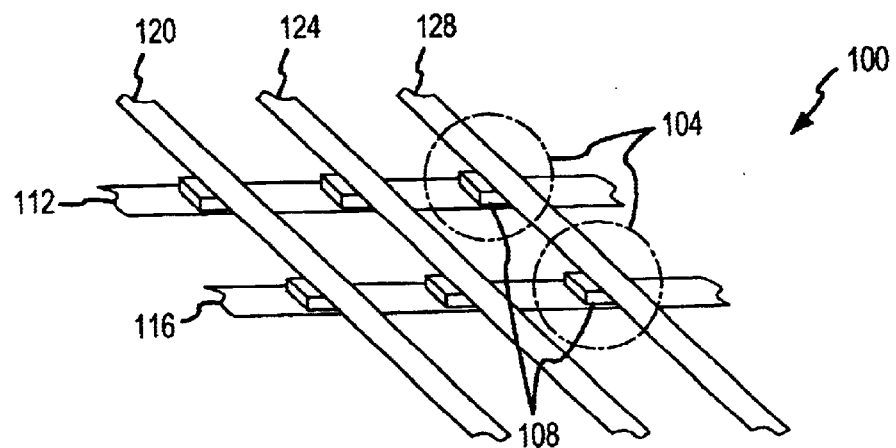
FIG. 1
(PRIOR ART)
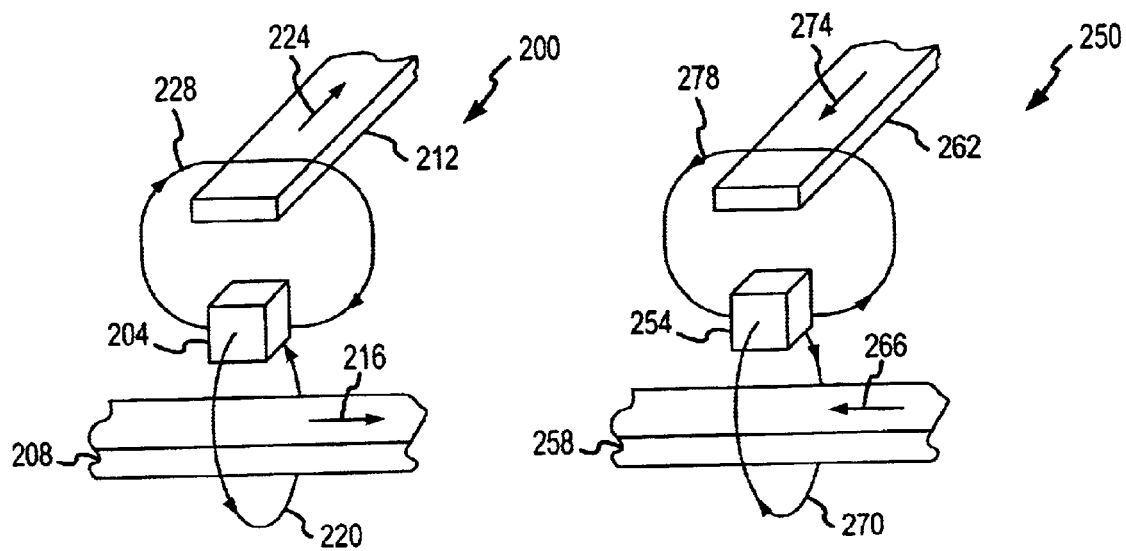
FIG. 2A
(PRIOR ART)
FIG. 2B
(PRIOR ART)

SYSTEM AND METHOD FOR ENABLING CHIP LEVEL ERASING AND WRITING FOR MAGNETIC RANDOM ACCESS MEMORY DEVICES

CROSS-REFERENCE TO RELATED APPLICATION

This application is a continuation of U.S. patent application. Ser. No. 10/163,476, filed Jun. 5, 2002 now U.S. Pat. No. 6,522,577.

TECHNICAL FIELD

The present invention is directed to magnetic memory devices, specifically, magnetic random access memory devices. More particularly, the present invention is directed to a method and system for facilitating erasing and writing to magnetic memory devices.

BACKGROUND OF THE INVENTION

Magnetic or magnetoresistive random access memory ("MRAM") devices offer advantages over conventional transistor-based random access memory ("RAM") devices and rewriteable nonvolatile read only memory devices. MRAM devices exploit the inherent nonvolatility of magnetic storage, used in early RAM devices, and long used in sequential memory devices in disk and tape storage. Unlike dynamic random access memory ("DRAM") devices which consume appreciable quantities of power in having to be continually refreshed to preserve the integrity of their memory contents, JAM cells do not need to be refreshed. In fact, unlike transistor-based RAM devices, once a cell of an MRAM device is polarized to its desired state, the cell retains its polarity without having to be supplied with power. Furthermore, unlike nonvolatile flash electronically erasable programmable read only ("flash EEPROM") memories, the contents of which can become corrupted with heavy use, MRAM devices are highly reliable. Moreover, while flash EEPROM devices can only be rewritten by erasing them and rewriting them in their entirety, cells in MRAM devices can be selectively written and rewritten without erasing the contents stored in the entire device.

Unlike previous uses of magnetic storage, such as disk and tape storage or bubble memory, MRAM devices provide direct, random access to their contents. Accordingly, MRAM devices provide the advantages of conventional RAM devices with the reliable nonvolatility of magnetic storage.

MRAM devices exploit the inherent interrelationship between the flow of electric current and corresponding magnetic fields. As is known in the art, a current flowing through a longitudinal conductor creates a magnetic field which encircles latitudinally about the axis of the longitudinal conductor. Specifically, MRAM devices exploit this interrelationship by using electric currents to generate magnetic fields which, in turn, are applied in close proximity to storage elements comprised of magnetically susceptible materials. Electric currents directed in a first direction results in a magnetic field having a corresponding first polarity. Exposed to the field of that corresponding polarity, if the field has sufficient magnitude, the magnetically susceptible element becomes magnetized in that same polarity. The magnetic field generated by the magnetized element then is capable of reacting to other applied magnetic fields, such as those caused by other currents flowing through the conductor. As a result, if an electric current of the same polarity was applied to the same conductor which first caused the element to become magnetized, the magnetic field of that magnetized element would not resist that current. On the other hand, if an electric current of opposite polarity was applied to the conductor, inducing a magnetic field of opposite polarity to encircle the conductor, those magnetic fields would conflict, and affect the resistivity of the conductor to the flow of current. Measuring the discrepancies in current caused by the differing resistance encountered as a result of the influence of these previously magnetized elements allows the stored polarity of these elements to be read.

It will be appreciated that, while a current of opposite polarity applied to the conductor will be opposed by the current induced by the magnetic element, that current of opposite polarity will not necessarily repolarize the magnetic field of that element. Magnetic materials exhibit a hysteresis effect in that a stronger current must be applied to repolarize them than might be required to polarize them initially. This principle is relied upon by MRAM devices: currents of lower magnitude can be used to detect the magnetic field created in the magnetic elements and thereby allow the bit written to that magnetic element to be read, while currents of greater magnitude generate magnetic fields which can be used to overcome hysteresis and write or rewrite the bit written to that magnetic element. However, as is understood in the art, an acknowledged problem in MRAM devices is that relatively high currents are required to induce a magnetic field of sufficient magnitude to reliably write and rewrite MRAM memory cells.

As shown in FIG. 1, an MRAM device comprises a Cartesian array 100 of MRAM memory cells 104. Each MRAM memory cell 104 comprises an element of magnetically susceptible material 108 disposed at an intersection of a row line 112 or 116 and a column line 120, 124, or 128. Electrical current is selectively applied to the row lines 112 and 116 and column lines 120, 124, or 128 to effect writing and reading of data to and from each of the memory cells. As is known in the art, writing these cells is accomplished by selectively and simultaneously directing the current in the row lines 112 and 116 and column lines 120, 124, and 128 so as to subject a particular element 108 to a desired combination of magnetic fields generated by the current flowing through the conductive lines.

FIGS. 2A and 2B show how a magnetic element can become polarized and, therefore, written. FIG. 2A shows an MRAM cell 200 which, physically, is comprised of magnetic element 204 disposed at the intersection of the row line 208 and the column line 212. An electrical row current of a first polarity 216 is applied to the row line 208 and thereby induces a magnetic flux field 220 of a first polarity to which the magnetic element 204 is exposed. At the same time, an electrical column current 224 is applied to the column line 212 and thereby induces a magnetic field 228 to which the magnetic element 204 is exposed. The combination of these complementary magnetic fields 220 and 228 cause the magnetic element to become polarized to radiate a composite magnetic field in a predetermined direction to represent a stored data bit. Once the magnetic element 204 has become polarized, the magnetic element 204 generates a magnetic field which, as previously described, will interact with the magnetic field generated by currents of a different polarity flowing through the row line 208 and column line 212. It will be appreciated that, as in any Cartesian grid, selection of a single row and a single column singularly identify a single point on the grid. Correspondingly, applying the row current 216 to the row line 208 and the column current 224 to the column line 212 allow the individual MRAM cell 200 at the intersection of the row line 208 and the column line 212 to be programmed.

FIG. 2B, for the sake of completeness, shows the opposite case in which an MRAM cell 250 is programmed to store a magnetic field of the opposite polarity. If in the example shown in FIG. 2A, the field stored in the magnetic element 204 of the MRAM cell 200 is considered to represent a logical zero, FIG. 2B shows the MRAM cell 250 being programmed to read as a logical one. The magnetically susceptible element 254 disposed at the intersection of the row line 258 and the column line 262 exposed to an electrical row current of a first polarity 266 applied to the row line 258 and induces a magnetic field 270 of a first polarity. At the same time, a column current 274 is applied to the column line 262 and induces a magnetic field 278 to which the magnetic element 254 is exposed. The composite magnetic field of magnetic fields 270 and 278 causes the magnetic element 254 to become polarized to radiate a magnetic fields of opposite polarity.

Once programmed, magnetic elements 204 and 254 in FIGS. 2A and 2B, respectively, will retain their magnetic fields in the absence of power. Accordingly, MRAM array 100 (FIG. 1) will retain the data stored therein where it can be retrieved upon being accessed by the system (not shown) served by the array 100 without having to be refreshed, reloaded, or rebooted.

Despite the advantages MRAM devices afford, however, they do present disadvantages. For example, because MRAM cells retain the data stored therein even when not supplied with power, affirmative steps must be taken to erase sensitive or otherwise unwanted data. One way to erase such data is to overwrite the contents of every cell in accordance with the steps described previously in connection with FIGS. 2A and 2B. Considering the hysteresis effect previously described, rewriting these cells could consume an appreciable amount of power. Writing the MRAM array with new data to be used by another application would necessarily overwrite and erase old data. However, in an age where data privacy and security becomes increasingly more important, and MRAM cells are nonvolatile, it would be desirable to be able to erase data from an MRAM array or a section thereof without having to rewrite the array with bogus data solely for the sake of erasing the data. Similarly, it would be desirable to facilitate the ability to write or rewrite MRAM cells without having to apply the high degree of current to the row and column lines required to overcome the hysteresis effect.

An additional concern arises from the possibility that the conductive row and column lines themselves could become magnetized through being exposed to the magnetic fields radiated by the magnetic elements. This could pose a problem in reading the MRAM cells. As previously described, the MRAM cells are read by applying electric currents to the row and column lines and measuring whether any resistance was encountered as a result of the magnetic fields stored in the magnetic elements at the intersections of those lines. If the conductive row and column lines were to become magnetized, thereby radiating their own magnetic fields that would affect the longitudinal flow of current through these lines, it could skew the reading of what was stored in the magnetic elements. It would be desirable to be able to demagnetize these lines.

It is to these ends that embodiments of the present invention are directed.

SUMMARY OF THE INVENTION

The present invention employs one or more switchable, close proximity electromagnets as part of the MRAM device circuit package to apply external magnetic fields to the magnetic elements and conductive lines of the MRAM array. An external magnetic field of sufficient magnitude could be induced to overwrite each of the targeted cells in the MRAM array. Alternatively, currents of decreasing magnitude and reversing polarity could be applied to the electromagnet to demagnetize the cells, as opposed to overwriting the contents of the cells.

In addition, the generated magnetic fields could be produced so as to complement the magnetic fields induced by application of current to the row and column lines of the MRAM array, thereby facilitating writing of data to magnetic elements while applying less power to the row and column lines. As described in the background of the invention, a relatively high current might be required to generate a magnetic field of sufficient magnitude to write or rewrite a memory cell. However, if an electromagnet of the present invention were used to generate an ambient magnetic field of the polarity desired to be programmed to the selected MRAM cells, a lesser current would be required. As long as the combination of the ambient field created by an electromagnet of the present invention and the localized magnetic fields created by applying appropriate row and column currents to the appropriate row and column lines, the selected MRAM cells could be written with application of currents of lesser magnitude applied to those conductive lines. In accordance with the first disclosed use of the invention, a magnetic field of sufficiently high magnitude would erase the MRAM array, while a magnetic field of lesser magnitude could be combined with the selectively applied row and column line currents to selectively write to the MRAM cells.

Further, diagonally disposed electromagnets could be used to generate these magnetic fields, and could also be used to demagnetize the conductive row and column lines. Because the conductive lines are not comprised of magnetically susceptible materials, any magnetic fields needed to demagnetize the row and column lines would not be of sufficient magnitude to affect the magnetic fields written to the magnetic elements of the MRAM cells.

BRIEF DESCRIPTION OF THE DRAWINGS

FIG. 1 is a perspective diagram of a conventional MRAM memory array.

FIG. 2A is an enlarged perspective view of a single conventional MRAM memory cell to which a 0 is being written.

FIG. 2B is an enlarged perspective view of a single conventional MRAM memory cell to which a 1 is being written.

DETAILED DESCRIPTION OF THE INVENTION

Figure 3:
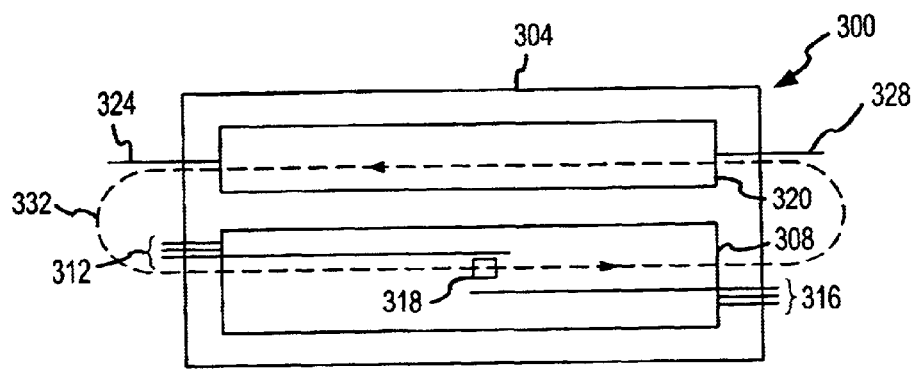
FIG. 3 is a cross-sectional view of an embodiment of the present invention employing a single electromagnetic device.

FIG. 3 shows a cross-sectional view of an MRAM device 300 adapted to use an embodiment of the present invention. The circuit package 304 of the MRAM device 300 comprises two principal components. First, the MRAM device 300 comprises an MRAM array 308, accessible by row lines 312 and column lines 316, and supporting a number of magnetic elements 318. Second, the MRAM device 300 comprises an electromagnet 320 driven by power lines 324 and 328 in accordance with a first embodiment of the present invention. Disposed within the circuit package 304, the electromagnet 320 can selectively generate a magnetic field 332 which can influence magnetic elements 318 in the MRAM array 308. FIG. 3 shows an embodiment of the present invention in which a single electromagnet 320 is used to work with the MRAM device 300.

As shown, the flux of the magnetic field 332 generated by the electromagnet 320 interacts with magnetic fields generated by the magnetic elements 318. The magnitude and polarity of the current applied to the electromagnet 320 through its power lines 324 and 328 controls the magnitude and polarity of the generated magnetic field 332, respectively. As is known in the art, longitudinal flow of current through a conductor in a first direction results in a latitudinal flow of magnetic flux around the conductor in a first polarity. Reversing the flow of the current through the conductor results in a latitudinal flow of magnetic flux around the conductor in an opposite polarity. Thus, application of a current of one polarity may result in the electromagnet 320 generating the magnetic field 332 of the polarity depicted, and reversing the polarity of the current would result in the generation of a magnetic field of a polarity opposite to that of magnetic field 332 shown in FIG. 3. Also, as indicated by Maxwell's equations, the force of the magnetic field 332 generated is proportional to the current applied to the electromagnet 320.

Figure 4:
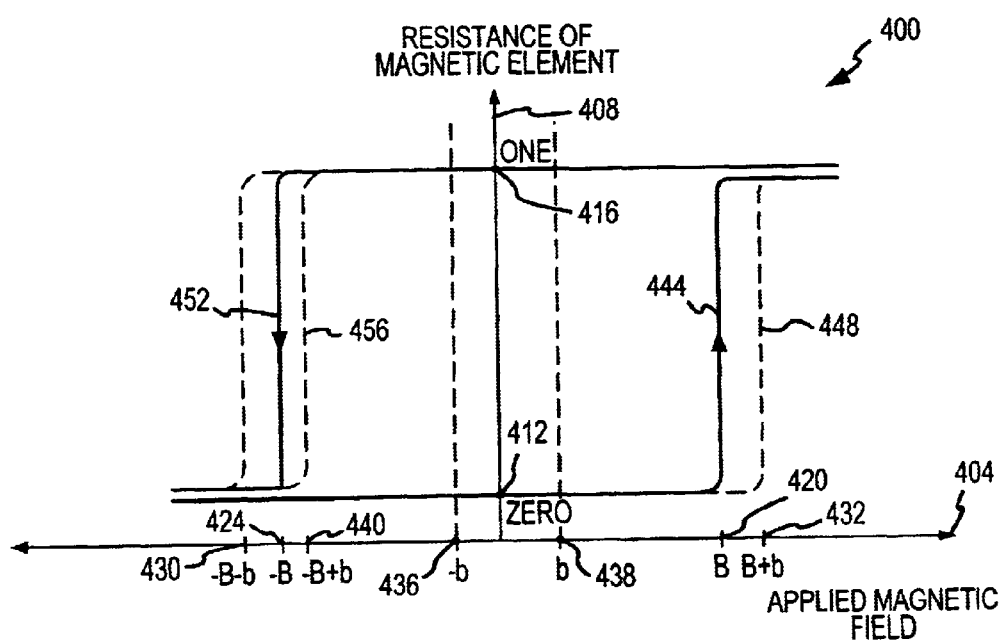
FIG. 4 is a hysteresis curve of an MRAM cell showing the magnetic field required to magnetize and remagnetize a magnetic element.

To better illustrate how embodiments of the present invention operate, FIG. 4 shows the hysteresis graph 400 for a typical magnetically susceptible element. The abscissa 404 represents the magnetic field applied to the magnetic element, while the ordinate 408 represents the magnetoresistance caused by the magnetic element as a result of the magnetic element being programmed by an applied magnetic force. As previously discussed, practically, the magnetoresistance of the magnetic element results in its contents being read as either a logical ZERO 412 or logical ONE 416. As shown in the graph 400, the application of a magnetic field of threshold magnitude B 420 is required to polarize the magnetic element to its ONE 416 state. Alternatively, the application of a magnetic field of the same magnitude but opposite polarity −B 424 is required to repolarize the magnetic element to its ZERO 412 state.

It will be appreciated that, because magnetic fields are vectorized forces, the strength of the magnetic field applied must not only reach the magnitude of B 420 or B−424, but also must overcome any existing, opposing magnetic field. For example, if an ambient magnetic field of magnitude −b 436 exists, a magnetic field of B+b 432 must be applied to the magnetic element to polarize the element to its ONE 416 state. This magnetic field of −b 436 could be ambient in the environment surrounding the magnetic element, or it could represent the magnetic field generated by the magnetic element itself, by an array of magnetic elements as a whole, by magnetization of the conductive row and column lines, or by a combination of these. In practice, therefore, a magnetic field of greater than B 420 will have to be applied to repolarize magnetic elements in the presence of an ambient magnetic field, including whatever field is generated by the magnetic element itself. In other words, the presence of the ambient magnetic field −b 436 shifts the hysteresis curve to repolarize the magnetic element from path 444 at B 420 to path 448 at B+b 432.

Correspondingly, if an ambient magnetic field having the same polarity as the magnetic field required to magnetize the element to the desired state, an external magnetic field of lesser magnitude will be sufficient to repolarize the magnetic element. Again, if the ambient magnetic field is of magnitude −b 436, but this time it is desired to repolarize the magnetic element to its ZERO 412 state, an external magnetic field of −B+b 440, having a magnitude of less than −B 424, is needed to repolarize the magnetic element. In other words, the presence of the ambient magnetic field −b 436 shifts the hysteresis curve to repolarize the magnetic element from path 452 at −B 424 to path 456 at −B+b 440. It will be subsequently appreciated that embodiments of the present invention both exploit and can redress the effects of ambient magnetic fields such as that at −b 436.

By varying the polarity and magnitude of the current applied to the control lines 324 and 328 of the electromagnet 320, embodiments of the present invention can be put to a number of different uses. One embodiment of the present invention can be used to erase the contents of the MRAM array 308. With regard to FIG. 3, it can be appreciated that the magnetic elements 318 of the MRAM array 308, having been put to use, will have been programmed to differing magnetic states. An embodiment of the present invention could be used to erase the programming of the magnetic elements in two different ways.

First, an embodiment of the present invention could be used to generate a magnetic field which would overwrite the contents of each of the magnetic elements 318. FIG. 4 shows hysteresis curves for a magnetic element used in an MRAM array. Considering the hysteresis conditions for such a system, allowing for ambient conditions, a hypothetical worst-case aggregate magnetic field generated by the plurality of magnetic elements 318 might have a magnitude of −b 436 (FIG. 4) or b 438. If all or nearly all of the magnetic elements 318 (FIG. 3) had been written as ZERO 412 (FIG. 4), an aggregate initial magnetic field of −b 436 would result. Introduction of an external magnetic field of B+b 432 would be required to overcome and overwrite that initial magnetic field of −b 436 and repolarize each of the magnetic elements to a ONE 416 state. On the other hand, if all or nearly all of the magnetic elements 318 (FIG. 3) had been written as ONE 412 (FIG. 4), an aggregate initial magnetic field of b 438 would result. Introduction of an external magnetic field of −B−b 430 would be required to overcome and overwrite that initial magnetic field of b 438 and remagnetize each of the magnetic elements to a ZERO 412 state. Thus, applying a current to the control lines 324 and 328 (FIG. 3) of the electromagnet 320 such that it generates a magnetic field 324 of magnitude B+b 432 (FIG. 4) or −B−b 430 will remagnetize every magnetic element 318 (FIG. 3) to read as a logical ZERO 412 (FIG. 4) or ONE 416, respectively. In other words, appropriately energizing the electromagnet 320 (FIG. 3) will overwrite and effectively erase all the data stored in the MRAM array 308. Without such erasure, as previously described, because MRAM memory is nonvolatile, potentially sensitive data would remain stored in the MRAM array even after the system in which the MRAM array is used has long been powered off or disconnected.

Second, the electromagnet 320 could also be used to erase the contents stored in the MRAM array 308 not by overwriting the contents stored therein, but by actually demagnetizing the array. As is known in the art and as is used to demagnetize objects ranging from hand tools to audiotape, magnetically susceptible materials can be demagnetized through the application of magnetic fields of alternating polarity and successively decreasing magnitude. Each applied field must be large enough to counteract the initial magnetic field. Thus, considering FIG. 4, an external magnetic field alternating between magnitudes −B−b 430 and B+b 432 would have to be applied initially to ensure demagnetization of the MRAM array 308 (FIG. 3), the polarity of the external magnetic field and its magnitude being sequentially alternated and reduced, respectively. This external magnetic field can be applied and controlled by alternating the polarity and systematically reducing the magnitude of the current applied to the control lines 324 and 328 of the electromagnet 320. Once the magnitude of the magnetic field drops to zero, the MRAM array 308 will be demagnetized, the magnetic elements 318 storing neither a ZERO 412 nor a ONE 416.

The electromagnet 320 of the disclosed embodiment of the present invention can be used not only to erase the MRAM array 308, but also to facilitate writing data bits to the magnetic elements 318 comprising storage of individual bits within the MRAM array 318. As previously described and is known in the art, the MRAM memory cells 104 (FIG. 1) are written to by applying appropriately polarized currents to the row lines 112 or 116 and column lines 120, 124, or 128 which intersect over the magnetic element 108 to be written. Because of the hysteresis effects shown in FIG. 4, a significant magnetic field must be induced to write to an MRAM memory cell 104 at an intersection of row lines 112 or 116 and column lines 120, 124, or 128 at the desired MRAM memory cell 104. Consequently, significant current must be applied to the desired row lines 112 or 116 and column lines 120, 124, or 128, which results in significant power being applied to and consumed by MRAM memory devices. Embodiments of the present invention can adjust the ambient magnetic field subsisting at each of the MRAM memory cells 104, decreasing the power required to write and rewrite MRAM memory cells.

Figure 5:
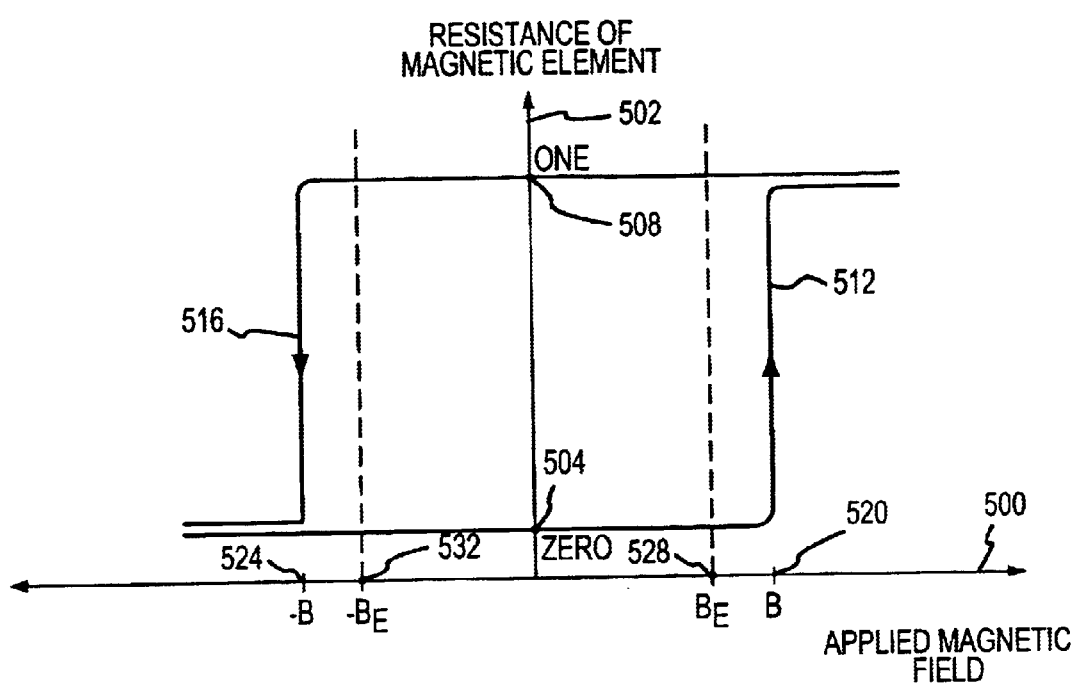
FIG. 5 is a hysteresis curve of an MRAM cell showing the magnetic field required to write to a magnetic element in the presence of an externally applied magnetic field.

FIG. 5 shows a hysteresis curve for writing to a magnetic element in the presence of an induced ambient magnetic field. As in FIG. 4, the abscissa 500 represents the magnetic field applied to the magnetic element, while the ordinate 502 represents the magnetoresistance caused by the magnetic element as a result of the magnetic element being programmed by an applied magnetic force. As previously described with regard to FIG. 4, it takes an applied magnetic field of a particular magnitude to write to a magnetic element, and a magnetic field of a slightly greater magnitude to write to a magnetic element in the presence of an ambient magnetic field of opposing polarity. However, just as the presence of an ambient magnetic field can impede the ability to repolarize and/or write to a magnetic element, an ambient magnetic field can be introduced to enhance that process.

With regard to FIG. 5, consider the situation where a magnetic element presently is magnetized the state representing ZERO 504, and it is desired to repolarize and thus rewrite that magnetic element to store a ONE 508. As previously described, ordinarily it would require an externally applied magnetic field of magnitude B 520 to change the state of the magnetic element along the curve 512 to repolarize the magnetic element to the ONE 508 state. As shown in FIG. 4, if the same result were desired in the presence of an ambient magnetic field of magnitude −b 436, an externally applied magnetic field of magnitude B+b 432 would be required to repolarize and rewrite the magnetic element. However, considering FIG. 5, if an ambient magnetic field of magnitude $B_E$ 528 and a constructive polarity enhancing the magnitude of the applied magnetic field subsisted at the point where the magnetic element was situated, the magnetic element could be repolarized from ZERO 504 to ONE 508 with an additional externally applied magnetic field of magnitude equal to the difference between $B_E$ 528 and B 520, or $B_E$−B.

In an embodiment of the present invention, the electromagnet 320 (FIG. 3) could actually be used to induce an external, facilitating magnetic field of magnitude $B_E$ 528 (FIG. 5). Thus, creation of a magnetic field of lesser magnitude of $B_E$−B would only be required to repolarize the CAM memory cell. Because the magnetic field needed from the row and column lines is reduced by the application of the externally applied facilitating magnetic field, less current needs to be applied to the row and column lines, saving power. At the same time, as long as the magnitude of the facilitating magnetic field $B_E$ 528 (FIG. 5) induced by the electromagnet 320 (FIG. 3) is less than B 520 (FIG. 5), the facilitating magnetic field induced by the electromagnet 320 (FIG. 3) by itself will not overwrite or rewrite any of the magnetic elements in the MRAM array. It should also be appreciated that increasing the magnitude of the facilitating magnetic field $B_E$ 528 (FIG. 5) can be used to increase the aggregate magnetic field applied to the magnetic elements in the MRAM array without increasing the current applied to the row and column lines. Thus, application of this field could be used not only in the interest of reducing the current applied to the row and column lines, but to increase the write reliability of the system.

It will be appreciated that the opposite process, to repolarize and rewrite magnetic element 318 (FIG. 3) from ONE 508 (FIG. 5) to ZERO 504 works in the same manner. The difference is one only of polarity. In this case, if the magnetic element stores a ONE 508, in the absence of an ambient magnetic field, an externally applied magnetic field of −B 524 would have to be applied to shift the magnetic field of the magnetic element along the hysteresis curve 516 to be rewritten as a ZERO 504. Using the electromagnet 320 (FIG. 3), applying a current to the control lines 324 and 328 equal in magnitude to that applied to generate a magnetic field of magnitude $B_E$ 528, but of opposite polarity, thereby resulting in the generation of a magnetic field of magnitude −$B_E$ 532. As a result of the application of that magnetic field, the magnitude of the magnetic field required to repolarize and rewrite the magnetic element would be −$B_E$+B. As previously described, use of the electromagnet 320 (FIG. 3) to apply this external magnetic field reduces the amount of current and power that must be applied to the row and column lines of the MRAM device.

Figure 6:
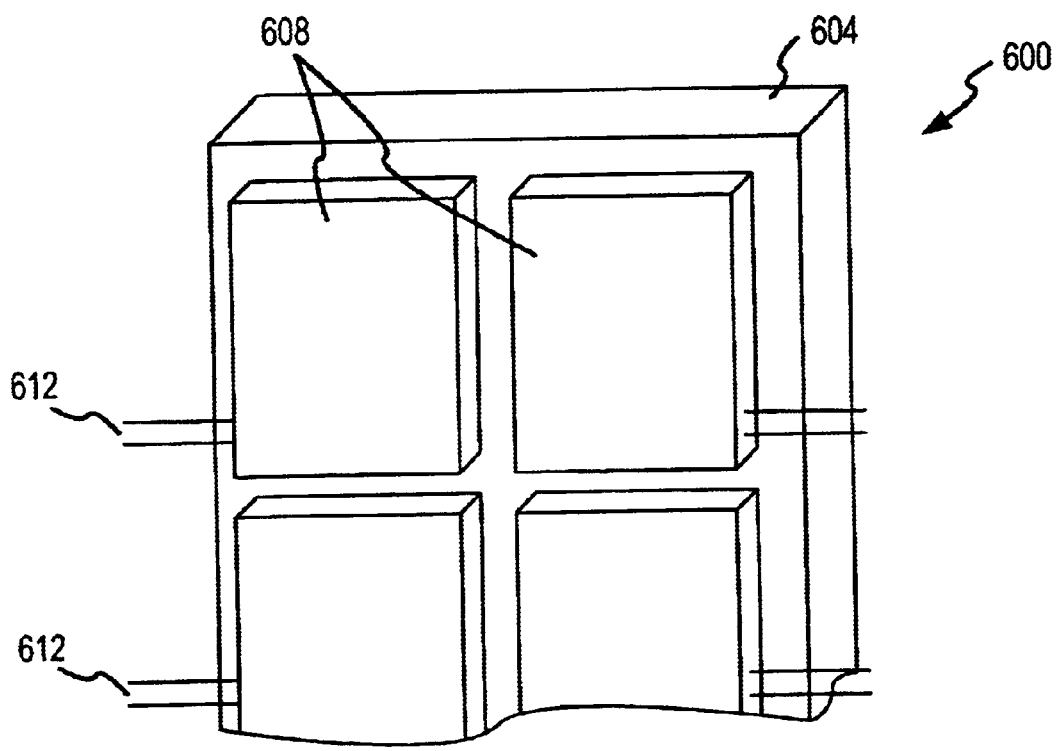
FIG. 6 is a perspective view of an embodiment of the present invention employing a plurality of separate electromagnetic devices.

Another embodiment of the present invention is shown in FIG. 6. In this embodiment of an MRAM memory device 600, the MRAM array 604 is equipped with a plurality of electromagnets 608, each controlled by separate control lines 612. Sizing, spacing, and powering of these electromagnets 608 are selected to confine the magnetic field (not shown) generated by the electromagnets 608 to a sector of the MRAM array 604. It will be appreciated that the operation of these electromagnets for erasing or for facilitating writing data to the MRAM array 604 is equivalent to that of the previously described embodiment. The essential difference in operation between this embodiment and the previously described embodiment is this embodiment employs more confined magnetic fields generated by the use of a number of smaller electromagnets 608 as opposed to one larger electromagnet 320 (FIG. 3) covering an entire MRAM array 308. While using separate electromagnets 608 (FIG. 6) makes control of this embodiment of the present invention more complex, it does afford greater control and power savings.

Selectively applying current to one or some of the control lines 612 of the appropriate electromagnets 608 can be used to erase or facilitate writing of one only one sector of the MRAM array 604. This embodiment allows for erasing one section if the MRAM array 604 or facilitating writing to only one section of the MRAM array 604. As a result, if the electromagnets 608 are to be used to erase data, the erasure can be confined to one sector of the MRAM array 604. Moreover, using smaller, sector-confined electromagnets 608 to facilitate writing of data to the array saves power. If data is only to be written to one sector of the MRAM array 604, only the electromagnet 608 disposed at the sector to be written needs to be powered. Less power is required to energize each of the smaller electromagnets 608 than is required to energize a larger electromagnet 320 (FIG. 3) spanning an entire MRAM array 308. Therefore, this embodiment of the invention reduces power consumption by not using current to generate an unnecessarily large magnetic field spanning parts of the MRAM array 604 to which data is not being written.

Figure 7:
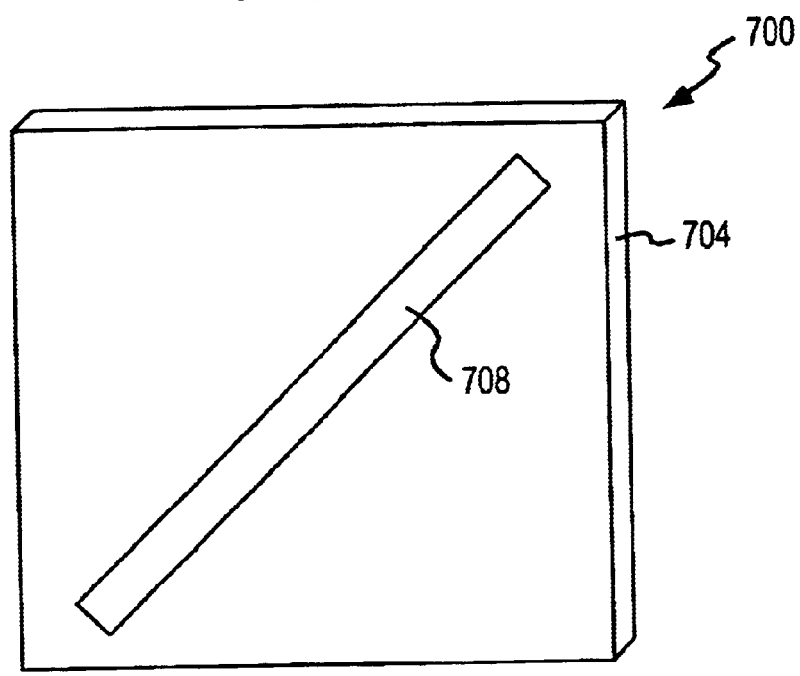
FIG. 7 is a perspective view of an embodiment of the present invention employing a diagonally disposed electromagnetic device.

An additional embodiment of the present invention is shown in FIG. 7. FIG. 7 shows an MRAM array 704 equipped with an electromagnet 708 disposed diagonally on a surface of the MRAM array 704 and, therefore, poles of the electromagnet are aligned diagonally with respect to poles of the magnetically susceptible elements (not shown) of the MRAM memory cells of the MRAM array 704. Although a single electromagnet is shown in FIG. 7, it will be appreciated that the MRAM array 704 could be fitted with a plurality of diagonally disposed electromagnets 708. The embodiment of the invention shown in FIG. 7 provides the same functions as previously disclosed embodiments of the invention. The embodiment of the invention shown in FIG. 7 allows for the erasing of the MRAM array 704 or for the generation of an externally applied electromagnetic field which facilitates magnetizing and writing of the magnetic elements in the MRAM array 704 with the application of lower power to the row lines and column lines of the MRAM array 704. With its poles disposed diagonally with respect to the poles of the magnetically susceptible elements of the MRAM array 704, vectorized components of the magnetic field generated by the electromagnet 708 can be used to create the desired magnetic fields previously described with regard to other embodiments of the invention.

In addition, this diagonally disposed electromagnet is well suited for demagnetizing row lines and column lines (not shown) of the MRAM array 704. If the row and column lines become magnetized, it can create some spurious resistance which possibly can lead to erroneous reading of the data stored in the magnetic elements (not shown). Using the same techniques previously described for erasing an MRAM array 704 or sections thereof by applying a current of reversing polarity and diminishing magnitude, a magnetic field of reversing polarity and diminishing magnitude is created which can erase any magnetization of the row and column lines. The diagonal disposition of the electromagnet 708 in this embodiment applies component fields across the grid formed by the row and column lines to facilitate demagnetization of these lines. It will be appreciated that, because the row and column lines are not comprised of materials which are magnetically susceptible to the same degree as the magnetic elements (not shown), a magnetic field of lesser magnitude will serve to demagnetize the row and column lines. As a result, the row and column lines can be demagnetized without effecting the magnetic fields of the magnetic elements storing the data, because the magnetic field induced to demagnetize the row and column lines will be of insufficient magnitude to repolarize the magnetically susceptible elements as depicted in the hysteresis curves shown in FIGS. 4 and 5.

Figure 8:
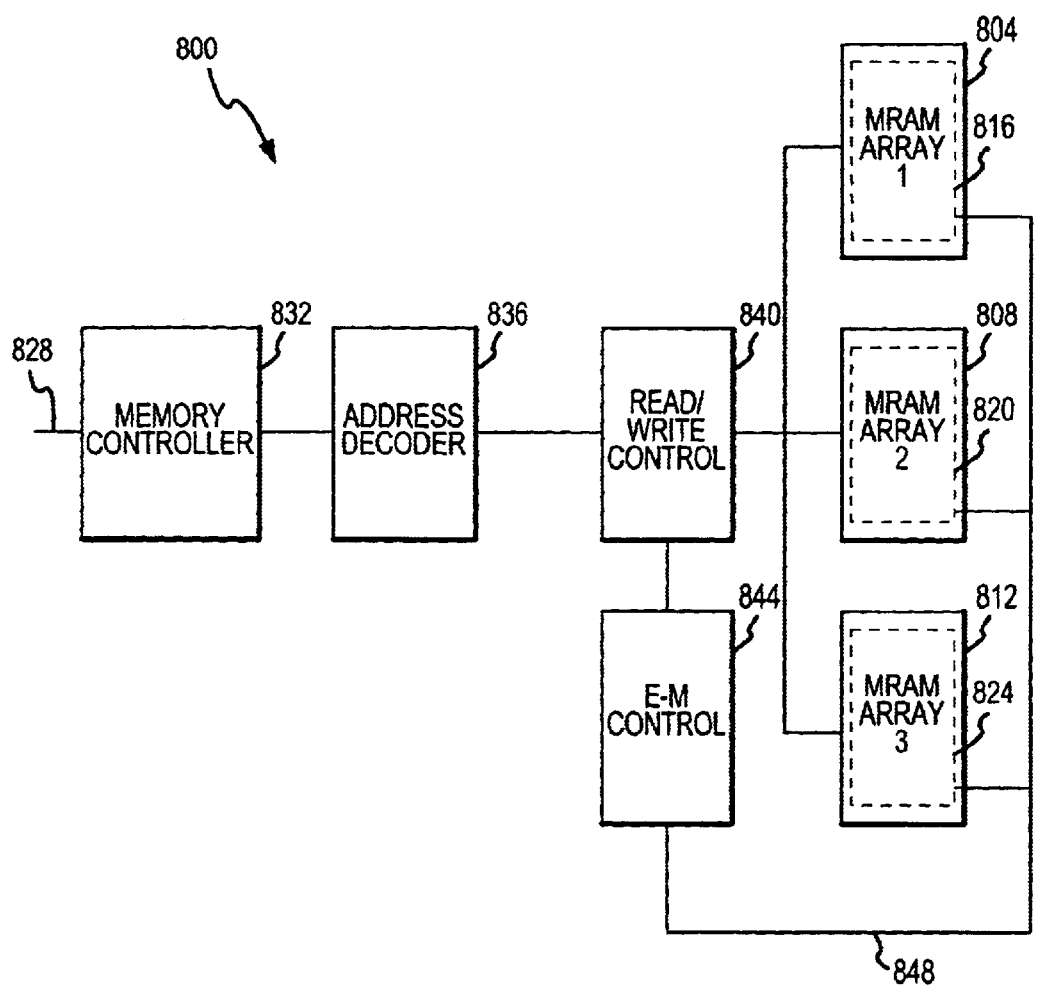
FIG. 8 is a block diagram of a memory subsystem using MRAM devices and an embodiment of the present invention.

FIG. 8 depicts a section of a memory subsystem 800 using MRAM devices 804, 808, and 812 for data storage. The MRAM devices 804, 808, and 812, as previously described, are equipped with electromagnetic devices 816, 820, and 824, to induce the magnetic fields as previously described. The subsystem 800 is connected to the system (not shown) through a bus 828. A memory controller 832 receives addresses, data, and commands from the bus 828 and, as appropriate, passes addresses to an address decoder 836 which determines which device or devices store the data to be read or where the data is to be written.

The subsystem 800 includes a read/write control unit 840 to manage the MRAM devices 804, 808, and 812, coordinating the application of current to the row and column lines (not shown) to effect the magnetization of the magnetic elements (not shown) which store the data. In using embodiments of the present invention, an electromagnet control unit 844 is used to control the externally applied magnetic fields to facilitate erasing, reading, writing, and/or demagnetizing of the MRAM arrays. The electromagnet control unit 844 controls the magnitude and polarity of the currents applied to the electromagnets 816, 820, and 824, associated with each of the MRAM devices 804, 808, and 812, respectively. As previously described, the electromagnets 816, 820, and 824, could each be a network of electromagnets, separately addressable and controllable by the electromagnet control unit 844, or possibly by control logic (not shown) associated with the individual MRAM devices 804, 808, and 812.

Working in concert with the read/write control unit 840, the electromagnet control unit 844 can direct the generation of electromagnetic fields in the appropriate MRAM device 804, 808, or 812, or section thereof, to facilitate writing to the memory cells in accordance with the preceding descriptions of the embodiments of the present invention. The read/write control unit 840 and the electromagnet control unit 844 work in concert. For example, when data is to be written to MRAM device 804, the electromagnet control unit 844 would direct the electromagnet 816 to generate a magnetic field of sufficient magnitude and appropriate polarity to facilitate writing of data to the appropriate row and column. As also previously described, the electromagnet control unit 844 could direct the electromagnet 816 to erase the contents of the MRAM device 804, or to demagnetize the row and column lines of the MRAM device 804.

Figure 9:
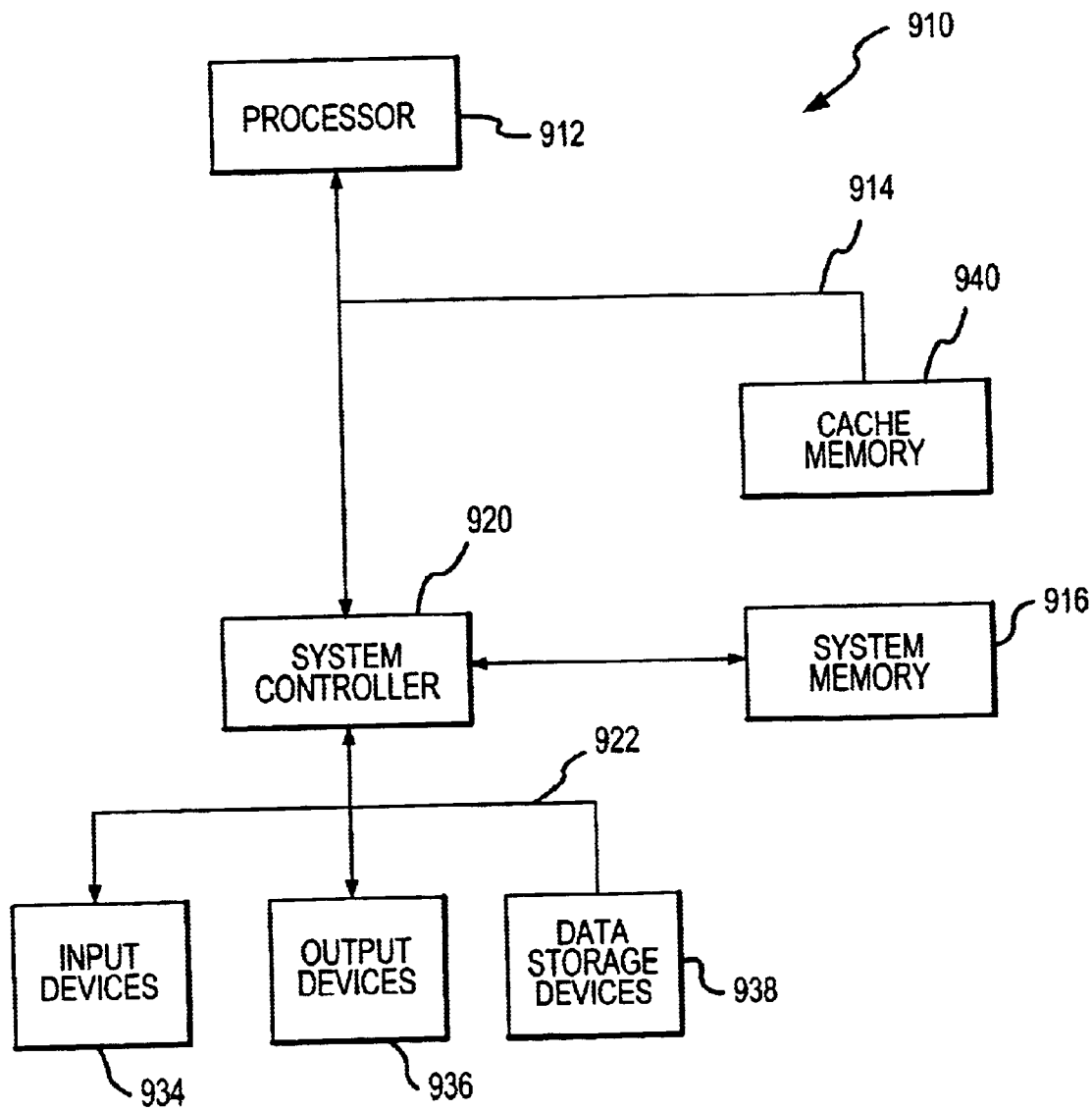
FIG. 9 is a block diagram of a computer system using MRAM memory devices and an embodiment of the present invention.

Embodiments of the invention can be incorporated into a computer system by one skilled in the art. FIG. 9 is a block diagram of a computer system 910 that includes a processor 912 for performing various computing functions by executing software to perform specific calculations or tasks. The processor 912 is coupled to a processor bus 914 that normally includes an address bus, a control bus, and a data bus (not separately shown). In addition, the computer system 910 includes a system memory 916, which might comprise the memory subsystem 800 (FIG. 8) employing the network of MRAM devices 804, 808, and 812. The system memory 916 is coupled to the processor bus 914 by a system controller 920 or similar device, which is also coupled to an expansion bus 922, such as a Peripheral Component Interface ("PCI") bus. A bus 926 coupling the system controller 920 to the system memory 916 also normally includes an address bus, a control bus, and a data bus (not separately shown), although other architectures can be used. For example, the data bus of the system memory 916 may be coupled to the data bus of the processor bus 914, or the system memory 916 may be implemented by a packetized memory (not shown), which normally does not include a separate address bus and control bus.

The computer system 910 also includes one or more input devices 934, such as a keyboard or a mouse, coupled to the processor 912 through the expansion bus 922, the system controller 920, and the processor bus 914. Also typically coupled to the expansion bus 922 are one or more output devices 936, such as a printer or a video terminal. One or more data storage devices 938 are also typically coupled to the expansion bus 922 to allow the processor 912 to store data or retrieve data from internal or external storage media (not shown). Examples of typical storage devices 938 include hard and floppy disks, tape cassettes, and compact disk read-only memories (CD-ROMs). The processor 912 is also typically coupled to cache memory 940 through the processor bus 914.

It is to be understood that, even though various embodiments and advantages of the present invention have been set forth in the foregoing description, the above disclosure is illustrative only. Changes may be made in detail, and yet remain within the broad principles of the invention.

What is claimed is:

1. A method for forming a packaged magnetoresistive random access memory (MRAM) device, comprising:

forming an MRAM memory array having a plurality of MRAM memory cells arranged in rows and columns of memory cells, each MRAM memory cell capable of sustaining a local magnetic field; and forming in the packaged MRAM memory device an electromagnetic device having a controllable variable magnetic field oriented relative to the MRAM memory array to affect the local magnetic field sustained by the plurality of MRAM memory cells and further having a longitudinal axis at an angle relative to the rows of the MRAM memory cells.

2. The method of claim 1 wherein forming the electromagnetic device comprises forming an iron core electromagnet in proximity to the MRAM memory array.

3. The method of claim 1 wherein forming the MRAM memory array comprises forming a plurality of MRAM memory cells arranged along row lines and column lines, each MRAM memory cell formed having a magnetically susceptible element disposed at an intersection of a row line and a column line.

4. The method of claim 1 forming the electromagnetic device having a controllable variable magnetic field oriented relative to the MRAM memory array to affect the local magnetic field sustained by the plurality of MRAM memory cells comprises forming an electromagnetic device oriented to generate a magnetic field having poles lying in a plane parallel with a plane containing the MRAM memory array.

5. The method of claim 1 wherein forming the MRAM memory array comprises forming a plurality of MRAM memory arrays having a plurality of MRAM memory cells and wherein forming the electromagnetic device comprises forming a plurality of electromagnetic devices, each device having a respective controllable variable magnetic field oriented relative to at least one of the plurality of MRAM memory arrays to affect the local magnetic field sustained by the MRAM memory cells of the at least one MRAM memory array.

6. A method for forming a magnetoresistive random access memory (MRAM) device, comprising:

forming an MRAM memory array having a plurality of MRAM memory cells arranged in rows and columns of memory cells, each MRAM memory cell capable of sustaining a local magnetic field; and providing an electromagnetic device proximate to the MRAM memory array and having a controllable variable magnetic field having magnetic poles oriented in a plane parallel with a plane containing the MRAM memory array and further having a longitudinal axis oriented at an angle relative to the orientation of the rows of memory cells to affect the local magnetic field sustained by the plurality of MRAM memory cells.

7. The method of claim 6, further comprising packaging the MRAM memory array and wherein providing the electromagnetic device comprises forming an iron core electromagnet in the packaged MRAM device and proximate to the MRAM memory array.

8. The method of claim 6 wherein forming the MRAM memory array comprises forming a plurality of MRAM memory arrays having a plurality of MRAM memory cells and wherein providing the electromagnetic device comprises forming a plurality of electromagnetic devices, each device having a respective controllable variable magnetic field having poles oriented relative to at least one of the plurality of MRAM memory arrays to affect the local magnetic field sustained by the MRAM memory cells of the at least one MRAM memory array.

9. A method for operating a magnetoresistive random access memory (MRAM) device having an array of MRAM memory cells, each cell having a magnetically susceptible element capable of sustaining a local magnetic field, the method comprising:

generating a magnetic field oriented with respect to the array of MRAM memory cells to simultaneously affect the local magnetic field sustained by a plurality of the MRAM memory cells; and adjusting the magnitude of the magnetic field to a magnitude sufficient to change the local magnetic field of a plurality of MRAM memory cells of the array.

10. The method of claim 9 wherein generating the magnetic field oriented with respect to the array of MRAM memory cells to affect the local magnetic field sustained by the MRAM memory cells and adjusting the magnitude of the magnetic field comprises controlling magnitude and polarity of a current applied to an electromagnetic device to control the orientation and magnitude of the magnetic field.

11. The method of claim 9 wherein adjusting the magnitude of the magnetic field comprises adjusting the magnitude of the magnetic field to polarize the local magnetic field of the MRAM memory cells of the array to a desired polarity.

12. The method of claim 9 wherein adjusting the magnitude of the magnetic field and performing the memory operation in the MRAM device comprises varying and successively reducing the magnetic field to erase the local magnetic field sustained by the MRAM memory cells of the array.

13. The method of claim 9 wherein the MRAM memory cells are arranged along row lines and column lines and wherein adjusting the magnitude of the magnetic field comprises varying and successively reducing the magnetic field to erase any local magnetic field sustained by the row lines and column lines.

14. A method for operating a magnetoresistive random access memory (MRAM) device having an array of MRAM memory cells, each cell having a magnetically susceptible element capable of sustaining a local magnetic field, the method comprising:

generating a magnetic field having poles oriented in a plane parallel with a plane containing the array of MRAM memory cells to simultaneously affect the local magnetic field sustained by a plurality of the MRAM memory cells; and adjusting the magnitude of the magnetic field to polarize the local magnetic field of the MRAM memory cells of the array to a desired polarity.

15. The method of claim 14 wherein generating the magnetic field comprises applying a current to an electromagnetic device disposed in the MRAM device and adjusting the magnitude of the magnetic field comprises adjusting the magnitude of the current applied to the electromagnetic device.

16. The method of claim 15 wherein the MRAM memory cells are arranged in rows and columns of MRAM memory cells and the electromagnetic device has a longitudinal axis at an angle relative to the rows of the MRAM memory cells.

17. A method for operating a magnetoresistive random access memory (MRAM) device having an array of MRAM memory cells, each cell having a magnetically susceptible element capable of sustaining a local magnetic field, the method comprising:

generating a magnetic field having poles oriented in a plane parallel with a plane containing the array of MRAM memory cells to simultaneously affect the local magnetic field sustained by a plurality of the MRAM memory cells; and varying and successively reducing the magnetic field to erase the local magnetic field sustained by the MRAM memory cells of the array.

18. The method of claim 17 wherein generating the magnetic field comprises applying a current to an electromagnetic device disposed in the MRAM device and adjusting the magnitude of the magnetic field comprises adjusting the magnitude of the current applied to the electromagnetic device.

19. The method of claim 18 wherein the MRAM memory cells are arranged in rows and columns of MRAM memory cells and the electromagnetic device has a longitudinal axis at an angle relative to the rows of the MRAM memory cells.

20. A method for operating a magnetoresistive random access memory (MRAM) device having an array of MRAM memory cells, each cell having a magnetically susceptible element capable of sustaining a local magnetic field, the method comprising:

generating a magnetic field having poles oriented in a plane parallel with a plane containing the array of MRAM memory cells to affect the local magnetic field sustained by the MRAM memory cells;

adjusting the magnitude of the magnetic field to a non-zero magnitude sufficient to polarize a plurality of the MRAM memory cells of the array.

21. The method of claim 20 wherein generating the magnetic field comprises applying a current to an electromagnetic device disposed in the MRAM device and adjusting the magnitude of the magnetic field comprises adjusting the magnitude of the current applied to the electromagnetic device.

22. The method of claim 21 wherein the MRAM memory cells are arranged in rows and columns of MRAM memory cells and the electromagnetic device has a longitudinal axis at an angle relative to the rows of the MRAM memory cells.

23. A method for operating a magnetoresistive random access memory (MRAM) device having an array of MRAM memory cells arranged along row lines and column lines, each cell having a magnetically susceptible element capable of sustaining a local magnetic field, the method comprising:

generating a magnetic field having poles oriented in a plane parallel with a plane containing the array of MRAM memory cells to affect the local magnetic field sustained by the MRAM memory cells; and varying and successively reducing the magnetic field to erase any local magnetic field sustained by the row lines and column lines.

24. The method of claim 23 wherein generating the magnetic field comprises applying a current to an electromagnetic device disposed in the MRAM device and adjusting the magnitude of the magnetic field comprises adjusting the magnitude of the current applied to the electromagnetic device.

25. The method of claim 24 wherein the MRAM memory cells are arranged in rows and columns of MRAM memory cells and the electromagnetic device has a longitudinal axis at an angle relative to the rows of the MRAM memory cells.

* * * * *

UNITED STATES PATENT AND TRADEMARK OFFICE
CERTIFICATE OF CORRECTION

PATENT NO. : 6,650,564 B1
DATED : November 18, 2003
INVENTOR(S) : Ren D. Earl and Jeffrey A. McKee It is certified that error appears in the above-identified patent and that said Letters Patent is hereby corrected as shown below:

Title page,
Item [57], ABSTRACT,
Lines 12 and 13, "In additional, diagonally" should read -- In addition, diagonally, --

Column 1,
Line 32, "JAM cells" should read -- MRAM cells --

Column 3,
Line 5, "if in the" should read -- If, in the --
Line 18, "magnetic fields of" should read -- magnetic field of --

Column 8,
Line 24, "CAM memory cell." should read -- MRAM memory cell. --

Signed and Sealed this

Thirteenth Day of July, 2004

JON W. DUDAS
*Acting Director of the United States Patent and Trademark Office*